US010801282B2

United States Patent
Shi et al.

(10) Patent No.: US 10,801,282 B2
(45) Date of Patent: Oct. 13, 2020

(54) SCREW DRILL BYPASS VALVE WITH LARGE DISPLACEMENT DIVERSION FUNCTION

(71) Applicant: CHINA UNIVERSITY OF PETROLEUM (EAST CHINA), Qingdao (CN)

(72) Inventors: Yucai Shi, Qingdao (CN); Zhibin Fan, Qingdao (CN); Zhichuan Guan, Qingdao (CN); Yongwang Liu, Qingdao (CN); Weixing Yang, Qingdao (CN); Zhixiang Teng, Qingdao (CN); Chenglin Fu, Qingdao (CN); Zaiqiang Miao, Qingdao (CN)

(73) Assignee: CHINA UNIVERSITY OF PETROLEUM (EAST CHINA), Qingdao (CN)

( * ) Notice: Subject to any disclaimer, the term of this patent is extended or adjusted under 35 U.S.C. 154(b) by 0 days.

(21) Appl. No.: 16/477,319

(22) PCT Filed: Feb. 22, 2018

(86) PCT No.: PCT/CN2018/076932
§ 371 (c)(1),
(2) Date: Jul. 11, 2019

(87) PCT Pub. No.: WO2019/127878
PCT Pub. Date: Jul. 4, 2019

(65) Prior Publication Data
US 2019/0368289 A1    Dec. 5, 2019

(30) Foreign Application Priority Data
Dec. 25, 2017    (CN) .......................... 2017 1 1416390

(51) Int. Cl.
*E21B 21/10*    (2006.01)
*E21B 21/08*    (2006.01)
*E21B 34/10*    (2006.01)

(52) U.S. Cl.
CPC ............ *E21B 21/103* (2013.01); *E21B 21/08* (2013.01); *E21B 34/10* (2013.01); *E21B 2200/06* (2020.05)

(58) Field of Classification Search
CPC ......... E21B 21/103; E21B 34/10; E21B 7/068
See application file for complete search history.

(56) References Cited

U.S. PATENT DOCUMENTS 6,386,299 B1 *   5/2002  Kato .......................... E21B 7/28
                                                                175/385
9,103,180 B2 *   8/2015  Roders .................. E21B 21/103
(Continued)

FOREIGN PATENT DOCUMENTS

CN    106285491 A  *  1/2017
WO    2019127878 A1    7/2019

OTHER PUBLICATIONS

Ashby, Michael F . . . (2011). Materials Selection in Mechanical Design (4th Edition)—6.12 Stiff, High-Damping Materials for Shaker Tables. (pp. 147-168). Elsevier. Retrieved from https://app.knovel.com/hotlink/pdf/id:kt008C7QQ2/nnaterials-selection-in-2/stiff-high-damping-materials (Year: 2011).*

(Continued)

*Primary Examiner* — Blake E Michener
*Assistant Examiner* — Theodore N Yao
(74) *Attorney, Agent, or Firm* — Hauptman Ham, LLP

(57) ABSTRACT

A screw drill bypass valve comprising a valve body, the valve body is internally provided with a first-level valve core and a second-level valve core, a first-level spring is arranged between the first-level valve core and the second-level valve (Continued)

core, a second-level spring is arranged between the second-level valve core and a valve seat, and a rigidity of the second-level spring is greater than that of the first-level spring; the first-level valve core is provided with an inner bypass hole, the valve body is provided with an outer bypass hole, and the inner bypass hole is conducted with the outer bypass hole when a flowing pressure within a fluid channel of drilling fluid disappears; the second-level valve core is provided with an inner diversion hole, the valve body is provided with an outer diversion hole.

2 Claims, 5 Drawing Sheets

(56) References Cited

U.S. PATENT DOCUMENTS

| | | | |
|---|---|---|---|
| 2006/0011354 A1* | 1/2006 | Logiudice | E21B 21/103 |
| | | | 166/380 |
| 2006/0243493 A1* | 11/2006 | El-Rayes | E21B 4/02 |
| | | | 175/107 |
| 2016/0160568 A1* | 6/2016 | Randall | E21B 43/26 |
| | | | 175/26 |
| 2017/0130544 A1* | 5/2017 | Roche | E21B 23/006 |
| 2018/0038180 A1* | 2/2018 | Cramer | E21B 34/08 |
| 2019/0003283 A1* | 1/2019 | Atkins | E21B 34/14 |
| 2019/0024480 A1* | 1/2019 | Thomson | E21B 34/10 |

OTHER PUBLICATIONS

International Search Report (Form PCT/ISA/210) dated Sep. 26, 2018 issued in corresponding International Application No. PCT/CN2018/076932.

Written Opinion of the International Search Authority (Form PCT/ISA/237) dated Sep. 26, 2018 issued in corresponding International Application No. PCT/CN2018/076932.

Chinese Search Report dated Jul. 20, 2018 issued in corresponding Chinese Application No. 201711416390.0.

First Office Action dated Jul. 31, 2018 issued in corresponding Chinese Application No. 201711416390.0.

\* cited by examiner

SCREW DRILL BYPASS VALVE WITH LARGE DISPLACEMENT DIVERSION FUNCTION

RELATED APPLICATIONS

The present application is a National Phase of International Application Number PCT/CN2018/076932, filed Feb. 22, 2018, and claims the priority of China Application No. 201711416390.0, filed Dec. 25, 2017.

TECHNICAL FIELD

The present disclosure relates to the field of petroleum drilling engineering, in particular to design and application of a screw drill, and specifically to a screw drill bypass valve with a large displacement diversion function and a method using the same.

BACKGROUND

A screw drill is the commonest downhole drill motor in the drilling engineering field. Main components of the screw drill include a bypass valve assembly, a motor assembly, a universal joint assembly, and a transmission shaft assembly. A basic structure and a working principle of the bypass valve assembly are shown in FIG. 1. When a drilling pump works normally, a pressure of a drilling fluid forces a valve core to move downward, compressing a spring and closing a channel (internally provided with a sieve plate for filtering foreign matters) on a valve body. At this time, the screw drill may circulate the drilling fluid or drill normally. When the drilling pump stops working, the pressure of the drilling fluid disappears, the compressed spring lifts the valve core, and a bypass valve is opened so that a space within a drill string and an annulus are communicated, thereby preventing the drilling fluid from overflowing from the drilling string at the time of tripping or kinging a connection, and further avoiding contamination of a drill floor and affecting normal work.

The screw drill has a strict requirement for a drilling fluid displacement. If the drilling fluid displacement is low, an output rotation speed and a torque of the screw drill are low, which is difficult to satisfy the drilling requirement; if the displacement is high, the output rotation speed and the torque are high, which may easily cause the screw drill to be damaged in advance, and thus is also difficult to satisfy the drilling requirement. When drilling is performed in a large-size well section, a high-angle well section or a horizontal section, a large drilling fluid displacement is usually required to improve a rock carrying efficiency. In this case, a rated displacement of an ordinary screw drill is difficult to satisfy the large displacement requirement, and thus a hollow rotor screw drill with a complex structure and a high cost is required to be adopted.

SUMMARY

To solve the above technical problems, the present disclosure provides a new screw drill bypass valve with a large displacement diversion function. In addition to basic functions (the bypass valve is closed in case of starting pump and opened in case of kinging a connection or tripping during pump stop) of an ordinary bypass valve, the new bypass valve may be applied to large displacement circulation and drilling in place of a hollow rotor with a complex structure and a high cost, so as to reduce a manufacturing cost of a screw drill, lower a drilling risk, and improve a rock carrying efficiency and a drilling speed.

Technical solutions adopted by the present disclosure are described as follows:

a screw drill bypass valve with a large displacement diversion function, including: a valve body, where the valve body is internally provided with a first-level valve core and a second-level valve core, the first-level valve core is arranged above the second-level valve core, a bottom of the second-level valve core is provided with a valve seat, a bottom of the valve seat is provided with a retaining ring, a first-level spring is arranged between the first-level valve core and the second-level valve core, a second-level spring is arranged between the second-level valve core and the valve seat, and the rigidity of the second-level spring is greater than that of the first-level spring; a penetrating fluid channel of the drilling fluid is formed at the centers of the first-level valve core and the second-level valve core, a side wall of the first-level valve core is provided with an inner bypass hole, a side wall of the valve body is provided with an outer bypass hole, and the inner bypass hole is conducted with the outer bypass hole when a flowing pressure within the fluid channel of the drilling fluid disappears; a side wall of the second-level valve core is provided with an inner diversion hole, the side wall of the valve body is provided with an outer diversion hole, and the inner diversion hole is conducted with the outer diversion hole when the flowing pressure within the fluid channel of the drilling fluid increases to a threshold.

Preferably, three inner bypass holes and three outer bypass holes are arranged respectively and distributed along the circumferences of the first-level valve core and the valve body at a spacing respectively; two inner diversion holes and two outer diversion holes are arranged respectively and symmetrically distributed along the circumferences of the second-level core and the valve body respectively.

Preferably, a bottom of the valve body is connected with a drill bit, and the drill bit is provided with a drill bit nozzle; the outer diversion hole is installed with a diversion nozzle.

Preferably, the outer bypass hole is installed with a sieve plate.

A working process of the above screw drill bypass valve is described as follows:

a. in case of starting pump: if a displacement of the drilling fluid does not exceed a rated displacement of the screw drill and the flowing pressure is relatively small, the first-level spring is compressed, the first-level valve core slides downward and sits on the second-level valve core, the outer bypass holes and the outer diversion holes are all closed, and all of the drilling fluid flows downward and drives a motor assembly of the screw drill to work normally; if the displacement of the drilling fluid exceeds the rated displacement of the screw drill and the flowing pressure is relatively large, the first-level spring and the second-level spring are both compressed, the first-level valve core and the second-level valve core both slide downward, the outer bypass holes are in a closed state, the outer diversion holes are in an open state, most of the drilling fluid flows downward and drives the motor assembly of the screw drill to work normally, and a small portion of the drilling fluid directly enters an annulus through the inner diversion holes and the outer diversion holes to ensure that the drilling fluid flowing through the motor assembly of the screw drill does not exceed the required rated displacement; and b. in case of stopping pump: the flowing pressures on the first-level spring and the second-level spring disappear, the first-level valve core and the second-level valve core both move upward to an initial position, the inner bypass holes and the outer bypass holes are at a same horizontal height, and the outer bypass holes are in the open state to implement the functions of an ordinary bypass valve.

A method of using the above screw drill bypass valve includes the following blocks.

At block (1), sizes of a drill bit nozzle and a diversion nozzle are designed.

It is assumed that a rated output displacement of a drilling pump is $Q_r$, a rated output pressure is $p_r$, an actual output displacement is $Q_s$, and an output pressure is $p_s$; a rated flow rate of a motor assembly of a screw drill is $Q_{mr}$, a rated pressure drop is $\Delta p_{mr}$, and a maximum pressure drop of a drill bit nozzle defined by a type of a transmission shaft is $\Delta p_s$.

A. The Screw Drill in an Idle Working Condition

When the screw drill runs at no load, it is assumed that the actual output pressure of the drilling pump is $p_{so}$; the flow rate of the drilling fluid flowing through the motor assembly and the drill bit nozzle is $Q_{mo}$, the pressure drop of the motor assembly is $\Delta p_{mo}$, and the pressure drop of the drill bit nozzle is $\Delta p_{bo}$; the flow rate of the drilling fluid flowing through the diversion nozzle is $Q_{vo}$, and the pressure drop of the diversion nozzle is $\Delta p_{vo}$; a circulating pressure consumption is $\Delta p_l$.

In the idle working condition, the pressure drop of the motor of the screw drill is a starting pressure drop, the flow rate of the drilling fluid flowing through the motor assembly and the drill bit nozzle and the pressure drop of the drill bit nozzle both reach a maximum value, the flow rate of the drilling fluid flowing through the diversion nozzle and the pressure drop of the diversion nozzle both reach a minimum value, and the flow rate of the drilling fluid flowing through each part and the pressure drop satisfy the following relationship.

$$Q_{mo} \leq Q_{mr} < Q_s \leq Q_r \quad (1)$$

$$Q_s = Q_{mo} + Q_{vo} \quad (2)$$

$$\Delta p_{bo} \leq \Delta p_s \quad (3)$$

$$p_{so} = \Delta p_l + \Delta p_{mo} + \Delta p_{bo} = \Delta p_l + \Delta p_{vo} < p_r \quad (4)$$

The output displacement $Q_s$ of the drilling pump, the output pressure $p_{so}$ of the drilling pump and the flow rate $Q_{mo}$ of the drilling fluid flowing through the motor assembly when the screw drill idles are selected; then, the circulating pressure consumption $\Delta p_l$, the pressure drop $\Delta p_{bo}$ of the drill bit nozzle, the flow rate $Q_{vo}$ of the drilling fluid flowing through the diversion nozzle and the pressure drop $\Delta p_{vo}$ of the diversion nozzle are calculated sequentially; finally, an equivalent area $A_{bo}$ of the drill bit nozzle and an equivalent area $A_{vo}$ of the diversion nozzle are calculated.

$$Q_{vo} = Q_s - Q_{mo} \quad (5)$$

$$\Delta p_l = k_l Q_s^{1.8} \quad (6)$$

$$\Delta p_{bo} = p_{so} - \Delta p_l - \Delta p_{mo} \quad (7)$$

$$\Delta p_{vo} = \Delta p_{mo} + \Delta p_{bo} = p_{so} - \Delta p_l \quad (8)$$

$$\Delta p_{bo} = \frac{0.05 \rho_d Q_{mo}^2}{C_b^2 A_b^2} \quad (9)$$

$$\Delta p_{vo} = \frac{0.05 \rho_d Q_{vo}^2}{C_v^2 A_v^2} \quad (10)$$

$$A_{bo} = \frac{Q_{mo}}{C_b} \sqrt{\frac{0.05 \rho_d}{\Delta p_{bo}}} \quad (11)$$

$$A_{vo} = \frac{Q_{vo}}{C_v} \sqrt{\frac{0.05 \rho_d}{\Delta p_{vo}}} \quad (12)$$

In the above formula, $\rho_d$ refers to a density of the drilling fluid, in the unit of g/cm$^3$; $A_{bo}$ and $A_{vo}$ refer to the equivalent area of the drill bit nozzle and the equivalent area of the diversion nozzle calculated in the unit of cm$^2$ according to the idle working condition of the screw drill; $C_b$ and $C_v$ refer to flow rate coefficients of the drill bit nozzle and the diversion nozzle, which are usually 0.95; $k_l$ refers to a circulating pressure consumption coefficient in the unit of MPa/(L/s)$^{1.8}$; other symbols have same meanings as above, all pressure units are MPa, and all flow rate units are L/s.

B. The Screw Drill in a Full-Load Drilling Working Condition

When the screw drill drills at full load, it is assumed that the actual output pressure of the drilling pump is $p_{sl}$; the flow rate of the drilling fluid flowing through the motor assembly and the drill bit nozzle of the screw drill is $Q_{ml}$, the pressure drop of the motor assembly is $\Delta p_{ml}$, and the pressure drop of the drill bit nozzle is $\Delta p_{bl}$; the flow rate of the drilling fluid flowing through the diversion nozzle is and $Q_{vl}$, the pressure drop of the diversion nozzle is $\Delta p_{vl}$.

In this working condition, the working pressure drop of the motor assembly of the screw drill is obviously greater than the starting pressure drop, the flow rate of the drilling fluid flowing through the motor assembly and the drill bit nozzle and the pressure drop of the drill bit nozzle both decrease, the flow rate of the drilling fluid flowing through the diversion nozzle and the pressure drop of the diversion nozzle both increase, and the flow rate of the drilling fluid flowing through each part and the pressure drop satisfy the following relationship.

$$Q_{ml} < Q_{mo} \leq Q_{mr} < Q_s \leq Q_r \quad (13)$$

$$Q_{sl} = Q_{ml} + Q_{vl} \quad (14)$$

$$\Delta p_{bl} \leq \Delta p_{sl} \quad (15)$$

$$p_{sl} = \Delta p_l + \Delta p_{ml} + \Delta p_{bl} = \Delta p_l + \Delta p_{vl} \leq p_r \quad (16)$$

The output displacement $Q_s$ of the drilling pump remains unchanged, the output pressure $p_{sl}$ of the drilling pump and the flow rate $Q_{ml}$ of the drilling fluid flowing through the motor assembly are selected; then, the pressure drop $\Delta p_{bl}$ of the drill bit nozzle, the flow rate $Q_{vl}$ of the drilling fluid flowing through the diversion nozzle, the output pressure $p_{sl}$ of the drilling pump and the pressure drop $\Delta p_{vl}$ of the diversion nozzle are calculated sequentially; finally, the equivalent area $A_{bl}$ of the drill bit nozzle and the equivalent area $A_{vl}$ of the diversion nozzle are calculated.

$$Q_{vl} = Q_s - Q_{ml} \quad (17)$$

$$\Delta p_{bl} = p_{sl} - \Delta p_l - \Delta p_{ml} \quad (18)$$

$$\Delta p_{vl} = \Delta p_{ml} + \Delta p_{bl} = p_{sl} - \Delta p_l \quad (19)$$

$$\Delta p_{bl} = \frac{0.05\rho_d Q_{ml}^2}{C_b^2 A_{bl}^2} \quad (20)$$

$$\Delta p_{vl} = \frac{0.05\rho_d Q_{vl}^2}{C_v^2 A_{vl}^2} \quad (21)$$

$$A_{bl} = \frac{Q_{ml}}{C_b}\sqrt{\frac{0.05\rho_d}{\Delta p_{bl}}} \quad (22)$$

$$A_{vl} = \frac{Q_{vl}}{C_v}\sqrt{\frac{0.05\rho_d}{\Delta p_{vl}}} \quad (23)$$

In the above formula, $A_{bl}$ and $A_{vl}$ refer to the equivalent area of the drill bit nozzle and the equivalent area of the diversion nozzle calculated in the unit of cm² according to the normal drilling working condition; other symbols have same meanings as above, all pressure units are MPa, and all flow rate units are L/s.

The equivalent area $A_b$ of the drill bit nozzle and the equivalent area $A_v$ of the diversion nozzle are selected based on the following principle by comprehensively considering calculation results given in two working conditions, that is, an idle operation and normal drilling of the screw drill.

$$A_b = \min(A_{bo}, A_{bl}) \quad (24)$$

$$A_v = \max(A_{vo}, A_{vl}) \quad (25)$$

At block (2), actual working parameters are calculated.

After the equivalent area $A_b$ of the drill bit nozzle and the equivalent area $A_v$ of the diversion nozzle are given, a corresponding relationship of the actual working pressure drop $\Delta p_m$ of the motor assembly and the actual flow rate $Q_m$ of the drilling fluid flowing through the motor assembly is as follows:

$$\Delta p_m + \frac{0.05\rho_d Q_m^2}{C_b^2 A_b^2} = \frac{0.05\rho_d Q_v^2}{C_v^2 A_v^2}. \quad (26)$$

To facilitate solving the equation, assuming that $Q_v=\chi Q_s$ and $\chi$ refers to a diversion coefficient, then $Q_m=(1-\chi)Q_s$, and the following equation is obtained by converting the formula (26).

$$\frac{0.05\rho_d(1-\chi)^2 Q_s^2}{C_b^2 A_b^2} + \frac{0.05\rho_d \chi^2 Q_s^2}{C_v^2 A_v^2} - \Delta p_m = 0 \quad (27)$$

A quadratic equation with one unknown is finally obtained by continuing performing conversion for the above formula.

$$\left(\frac{C_b^2 A_b^2}{C_v^2 A_v^2} - 1\right)\chi^2 + 2\chi - \left(1 + \frac{C_b^2 A_b^2}{0.05\rho_d Q_s^2}\Delta p_m\right) = 0 \quad (28)$$

For the above new screw drill bypass valve, the drilling fluid mainly flows through the motor assembly and the drill bit nozzle, only a small portion of the drilling fluid flows through the diversion nozzle, an equivalent diameter of the drill bit nozzle is usually greater than an equivalent diameter of the diversion nozzle, that is, $$\frac{C_b^2 A_b^2}{C_v^2 A_v^2} - 1 > 0,$$

and thus only one root in the above quadratic equation with one unknown is a positive value.

$$\chi = \frac{-1 + \sqrt{1 + \left(\frac{C_b^2 A_b^2}{C_v^2 A_v^2} - 1\right)\left(1 + \frac{C_b^2 A_b^2}{0.05\rho_d Q_s^2}\Delta p_m\right)}}{\frac{C_b^2 A_b^2}{C_v^2 A_v^2} - 1} \quad (29)$$

In the normal drilling condition, the diversion coefficient $\chi$ is obtained based on the formula (29) with a designated working pressure drop $\Delta p_m$ of the motor assembly; then, the flow rate $Q_m$ of the drilling fluid flowing through the motor assembly and the drill bit nozzle of the screw drill, the flow rate $Q_v$ of the drilling fluid flowing through the diversion nozzle, the pressure drop $\Delta p_b$ of the drill bit nozzle and the pressure drop $\Delta p_v$ of the diversion nozzle are obtained; finally, the actual output pressure $p_s$ of the drilling pump corresponding to the designated working pressure drop $\Delta p_m$ of the motor assembly is obtained.

At block (3), diversion effects corresponding to different motor pressure drops and the actual output pressure of the drilling pump are pre-calculated and then a curve graph is drawn. A load borne by the screw drill is determined by observing a change of the output pressure of the drilling pump to control a downhole drilling pressure reasonably.

Beneficial effects of the present disclosure are described below.

The screw drill bypass valve of the present disclosure may be applied to large displacement circulation and drilling in place of a hollow rotor design solution to reduce a manufacturing cost of a screw drill, facilitate improving a rock carrying efficiency of a large-size well section, a high-angle well section and a horizontal section, lower a drilling risk, and increase a drilling speed, in addition to basic functions of an ordinary bypass valve.

A specific using method is provided by the present disclosure based on the self-designed screw drill bypass valve with a large displacement diversion function. Through the method, diversion effects corresponding to different motor pressure drops and the actual output pressure of the drilling pump may be pre-calculated and the curve graph may be drawn, and the load borne by the screw drill may be determined by observing the change of the output pressure of the drilling pump like the ordinary screw drill, thereby reasonably controlling the downhole drilling pressure and facilitating directing an application in a drilling field.

DETAILED DESCRIPTION OF THE EMBODIMENTS

To solve the technical problems that an ordinary screw drill is difficult to apply to large displacement circulation and drilling and a hollow rotor screw drill has a complex structure and a high cost, the present disclosure provides a method of designing and using a new screw drill bypass valve with a diversion function, which may be applied to large displacement circulation and drilling in place of an existing hollow rotor design solution to facilitate improving a rock carrying efficiency of a large-size well section, a high-angle well section and a horizontal section, lower a drilling risk, and increase a drilling speed.

The present disclosure will be described below in detail in combination with accompanying drawings.

Figure 1:
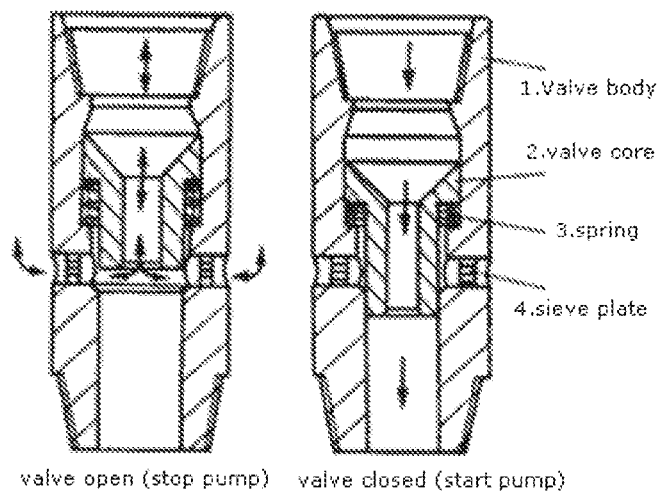
FIG. 1 is a schematic diagram illustrating a structure and a working principle of an ordinary screw drill bypass valve.
Figure 2:
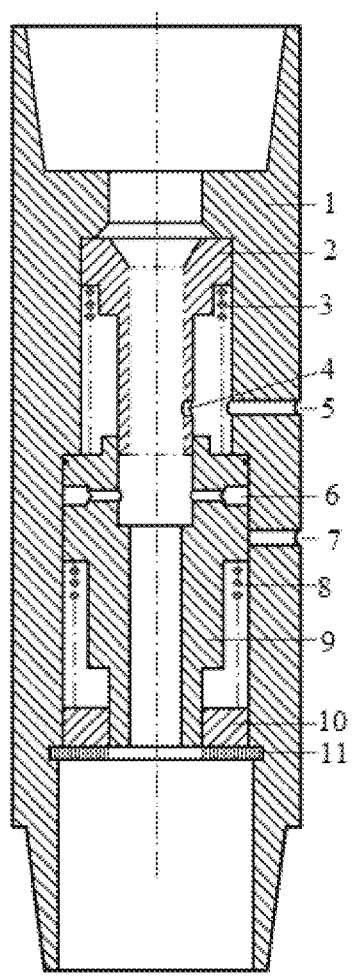
FIG. 2 is a schematic diagram illustrating a structure of a screw drill bypass valve with a large displacement diversion function according to an example of the present disclosure.

As shown in FIG. 2, a screw drill bypass valve with a large displacement diversion function, including a valve body 1, where the valve body 1 is internally provided with a first-level valve core 2 and a second-level valve core 9, the first-level valve core 2 is arranged above the second-level valve core 9, a bottom of the second-level valve core 9 is provided with a valve seat 10, a bottom of the valve seat 10 is provided with a retaining ring 11. A first-level spring 3 is arranged between the first-level valve core 2 and the second-level valve core 9, a second-level spring 8 is arranged between the second-level valve core 9 and the valve seat 10, and the rigidity of the second-level spring 8 is greater than that of the first-level spring 3 (the rigidity of the first-level spring 3 is smaller, and the rigidity of the second-level spring 8 is larger). A penetrating fluid channel of drilling fluid is formed at the centers of the first-level valve core 2 and the second-level valve core 9, a side wall of the first-level valve core 2 is provided with an inner bypass hole 4, a side wall of the valve body 1 is provided with an outer bypass hole 5, and the inner bypass hole 4 is conducted with the outer bypass hole 5 when a flowing pressure within the fluid channel of the drilling fluid disappears. A side wall of the second-level valve core 9 is provided with an inner diversion hole 6, the side wall of the valve body 1 is provided with an outer diversion hole 7, and the inner diversion hole 6 is conducted with the outer diversion hole 7 when the flowing pressure within the fluid channel of the drilling fluid increases to a threshold.

Three inner bypass holes 4 are arranged and distributed along a circumference of the first-level valve core 2 at a spacing; three corresponding outer bypass holes 5 are arranged and distributed along a circumference of the valve body 1 at a spacing. Two inner diversion holes 6 are arranged and symmetrically distributed along a circumference of the second-level core 9; two corresponding outer diversion holes 7 are also arranged and symmetrically distributed along the circumference of the valve body 1.

The bottom of the above valve body 1 is connected with a drill bit, and the drill bit is provided with a drill bit nozzle. The outer diversion hole 7 is installed with a diversion nozzle to facilitate adjusting a diversion proportion and a diversion effect.

The outer bypass hole is installed with a sieve plate for preventing rock debris in an annulus from entering an inner hole of a drill string.

The above first-level valve core 2 has a totally same function as an ordinary bypass valve, and the function of the second-level valve core 9 is to perform diversion during a large displacement.

Figure 3:
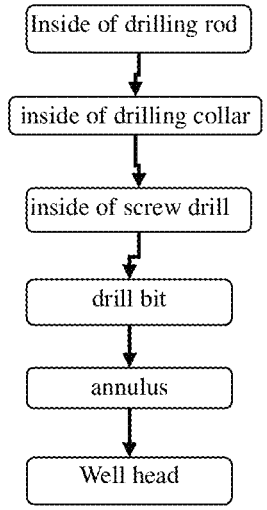
FIG. 3 is a schematic diagram illustrating a circulation route of drilling fluid during a normal displacement according to an example of the present disclosure.
Figure 4:
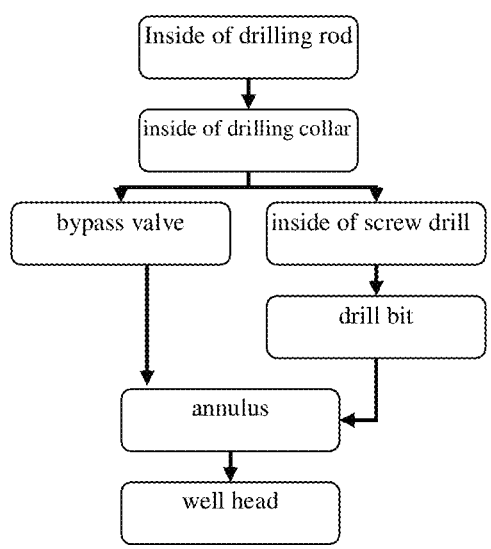
FIG. 4 is a schematic diagram illustrating a circulation route of drilling fluid during a large displacement according to an example of the present disclosure.

A working principle of the new screw drill bypass valve of the present disclosure is described below.

a. In case of starting pump: if a displacement of drilling fluid does not exceed a rated displacement of a screw drill and the flowing pressure is relatively small, the first-level spring 3 is compressed, the first-level valve core 2 slides downward and sits on the second-level valve core 9, the outer bypass holes 5 and the outer diversion holes 7 are all closed, a circulation route of the drilling fluid at this time is as shown in FIG. 3, and all of the drilling fluid flows downward and drives a motor assembly of the screw drill to work normally. If the displacement of the drilling fluid exceeds the rated displacement of the screw drill and the flowing pressure is relatively large, the first-level spring 3 and the second-level spring 8 are both compressed, the first-level valve core 2 and the second-level valve core 9 both slide downward, the outer bypass holes 5 are in a closed state, the outer diversion holes 7 are in an open state, the circulation route of the drilling fluid at this time is as shown in FIG. 4, most of the drilling fluid flows downward and drives the motor assembly of the screw drill to work normally, and a small portion of the drilling fluid directly enters the annulus through the inner diversion hole 6 and the outer diversion hole 7 to ensure that the drilling fluid flowing through the motor assembly of the screw drill does not exceed the required rated displacement.

b. In case of stopping pump: the flowing pressures on the first-level spring 3 and the second-level spring 8 disappear, the first-level valve core 2 and the second-level valve core 9 both move upward to an initial position shown in FIG. 2, the inner bypass hole 4 and the outer bypass hole 5 are overlapped in position, and the outer bypass holes 5 are in the open state to implement functions of an ordinary bypass valve.

As can be known from the structure and the working principle of the above new screw drill bypass valve, reasonably designing the sizes of the drill bit nozzle and the diversion nozzle becomes critical for ensuring that the new bypass valve can work in a set manner by distributing the output pressure and the displacement of the drilling pump reasonably to the screw drill, the diversion nozzle, the drill bit nozzle and the circulation system.

A method of using the screw drill bypass valve with a large displacement diversion function will be described below in detail, which includes the following blocks.

At block (1), sizes of a drill bit nozzle and a diversion nozzle are designed.

When the bypass valve with a large displacement diversion function is applied, an output displacement of a drilling pump may remain unchanged, but an output pressure of the drilling pump and a diversion effect of the bypass valve both change with a load borne by the screw drill. In this case, it is desired to reasonably select the sizes of the drill bit nozzle and the diversion nozzle by comprehensively considering two working conditions, that is, an idle operation and full-load drilling of the screw drill.

It is assumed that a rated output displacement of the drilling pump (a drilling fluid displacement) is $Q_r$, a rated output pressure (a pump pressure) is $p_r$, an actual output displacement is $Q_s$, and an output pressure is $\Delta p_s$; a rated flow rate of a motor assembly of the screw drill is $Q_{mr}$, a rated pressure drop is $\Delta p_{mr}$, and a maximum pressure drop of a drill bit nozzle defined by a type of a transmission shaft is $\Delta p_s$ (if the pressure drop of the drill bit nozzle is higher than the limit value, a bearing of the transmission shaft may be overloaded, thereby resulting in a damage of the transmission shaft in advance).

A. The Screw Drill in an Idle (No Drilling Pressure) Working Condition

When the screw drill runs at no load (no drilling pressure), it is assumed that the actual output pressure of the drilling pump is $p_{so}$; the flow rate of the drilling fluid flowing through the motor assembly and the drill bit nozzle is $Q_{mo}$, the pressure drop (a starting pressure drop) of the motor assembly is $\Delta p_{mo}$, and the pressure drop of the drill bit nozzle is $\Delta p_{bo}$; the flow rate of the drilling fluid flowing through the diversion nozzle is $Q_{vo}$, and the pressure drop of the diversion nozzle is $\Delta p_{vo}$; circulating pressure consumption (including a ground manifold, inside of a drill string and an annulus) is $\Delta p_l$.

In the idle working condition, the pressure drop of the motor of the screw drill is the starting pressure drop, the flow rate of the drilling fluid flowing through the motor assembly and the drill bit nozzle and the pressure drop of the drill bit nozzle both reach a maximum value, the flow rate of the drilling fluid flowing through the diversion nozzle and the pressure drop of the diversion nozzle both reach a minimum value, and the flow rate of the drilling fluid flowing through each part and the pressure drop satisfy the following relationship, as shown in FIG. 4.

$$Q_{mo} \leq Q_{mr} < Q_s \leq Q_r \quad (1)$$

$$Q_s = Q_{mo} + Q_{vo} \quad (2)$$

$$\Delta p_{bo} \leq \Delta p_s \quad (3)$$

$$p_{so} = \Delta p_l + \Delta p_{mo} + \Delta p_{bo} = \Delta p_l + \Delta p_{vo} < p_r \quad (4)$$

The output displacement $Q_s$ of the drilling pump, the output pressure $p_{so}$ and the flow rate $Q_{mo}$ of the drilling fluid flowing through the motor assembly when the screw drill is idle are selected; then, the circulating pressure consumption $\Delta p_l$, the pressure drop $\Delta p_{bo}$ of the drill bit nozzle ($\Delta p_{bo} \leq \Delta p_s$ is required), the flow rate $Q_{vo}$ of the drilling fluid flowing through the diversion nozzle and the pressure drop $\Delta p_{vo}$ of the diversion nozzle are calculated sequentially; finally, an equivalent area $A_{bo}$ of the drill bit nozzle and an equivalent area $A_{vo}$ of the diversion nozzle are calculated.

$$Q_{vo} = Q_s - Q_{mo} \quad (5)$$

$$\Delta p_l = k_l Q_s^{1.8} \quad (6)$$

$$\Delta p_{bo} = p_{so} - \Delta p_l - \Delta p_{mo} \quad (7)$$

$$\Delta p_{vo} = \Delta p_{mo} + \Delta p_{bo} = p_{so} - \Delta p_l \quad (8)$$

-continued $$\Delta p_{bo} = \frac{0.05 \rho_d Q_{mo}^2}{C_b^2 A_b^2} \quad (9)$$

$$\Delta p_{vo} = \frac{0.05 \rho_d Q_{vo}^2}{C_v^2 A_v^2} \quad (10)$$

$$A_{bo} = \frac{Q_{mo}}{C_b} \sqrt{\frac{0.05 \rho_d}{\Delta p_{bo}}} \quad (11)$$

$$A_{vo} = \frac{Q_{vo}}{C_v} \sqrt{\frac{0.05 \rho_d}{\Delta p_{vo}}} \quad (12)$$

In the above formula, $\rho_d$ refers to a density of the drilling fluid in the unit of g/cm$^3$; $A_{bo}$ and $A_{vo}$ refer to the equivalent area of the drill bit nozzle and the equivalent area of the diversion nozzle calculated in the unit of cm$^2$ according to the idle working condition of the screw drill; $C_b$ and $C_v$ refer to flow rate coefficients of the drill bit nozzle and the diversion nozzle, which are usually 0.95; $k_l$ refers to a circulating pressure consumption coefficient in the unit of MPa/(L/s)$^{1.8}$; other symbols have same meanings as above, all pressure units are MPa, and all flow rate units are L/s.

B. The Screw Drill in a Full-Load Drilling Working Condition

When the screw drill drills at full load, it is assumed that the actual output pressure of the drilling pump is $p_{sl}$; the flow rate of the drilling fluid flowing through the motor assembly and the drill bit nozzle of the screw drill is $Q_{ml}$, the pressure drop (the maximum working pressure drop) of the motor assembly is $\Delta p_{ml}$, and the pressure drop of the drill bit nozzle is $\Delta p_{bl}$; the flow rate of the drilling fluid flowing through the diversion nozzle is $Q_{vl}$, and the pressure drop of the diversion nozzle is $\Delta p_{vl}$.

In this working condition, the working pressure drop of the motor assembly of the screw drill is obviously greater than the starting pressure drop, the flow rate of the drilling fluid flowing through the motor assembly and the drill bit nozzle and the pressure drop of the drill bit nozzle both decrease, the flow rate of the drilling fluid flowing through the diversion nozzle and the pressure drop of the diversion nozzle both increase, and the flow rate of the drilling fluid flowing through each part and the pressure drop satisfy the following relationship, as shown in FIG. 4.

$$Q_{ml} < Q_{mo} \leq Q_{mr} < Q_s \leq Q_r \quad (13)$$

$$Q_{sl} = Q_{ml} + Q_{vl} \quad (14)$$

$$\Delta p_{bl} \leq \Delta p_{sl} \quad (15)$$

$$p_{sl} = \Delta p_l + \Delta p_{ml} + \Delta p_{bl} = \Delta p_l + \Delta p_{vl} \leq p_r \quad (16)$$

Figure 5:
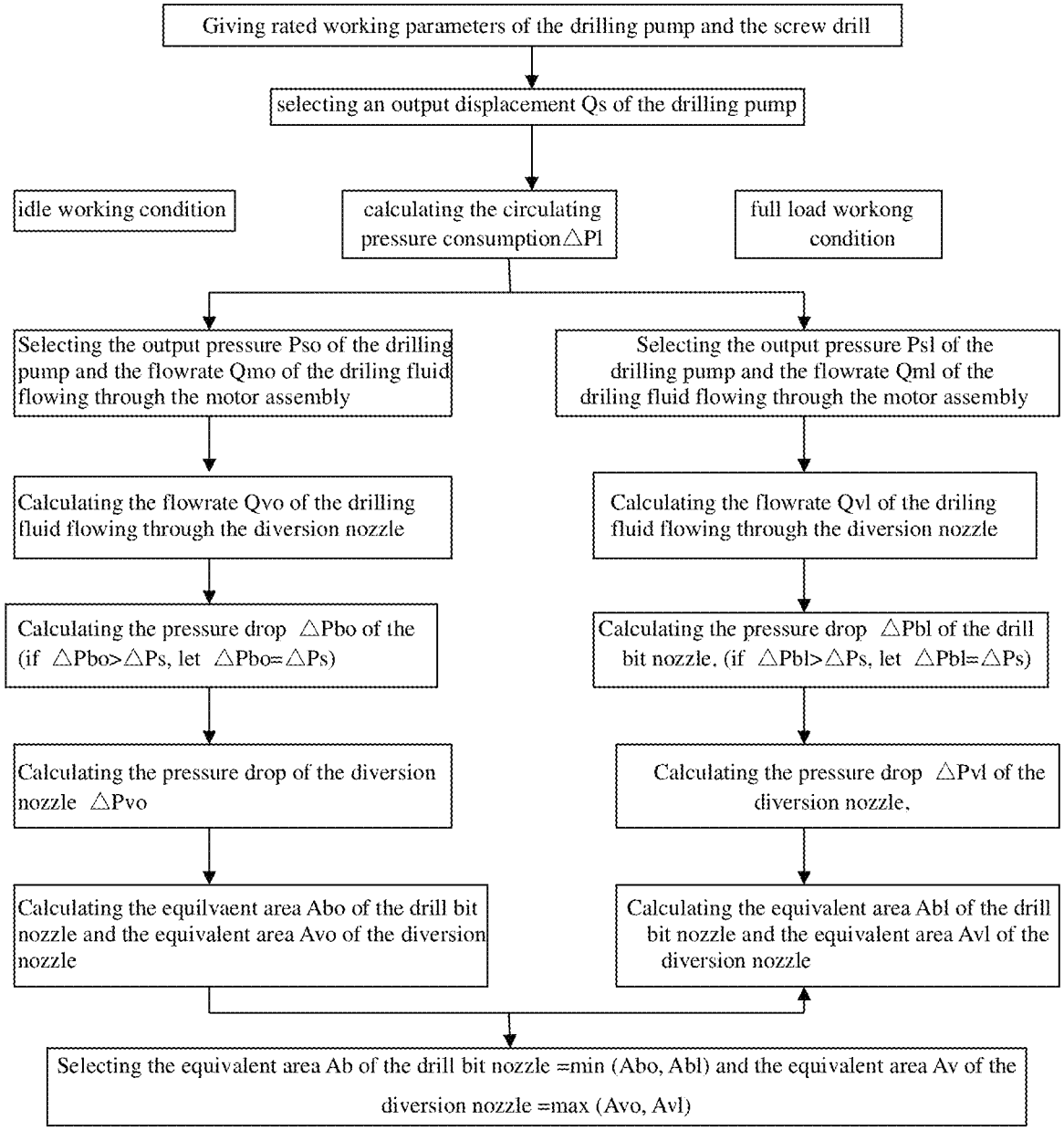
FIG. 5 is a flowchart illustrating a method of designing sizes of a drill bit nozzle and a diversion nozzle according to an example of the present disclosure.

It is required to solve relevant parameters based on the following procedure (refer to FIG. 5): the output displacement $Q_s$ of the drilling pump remains unchanged, the output pressure $p_{sl}$ of the drilling pump and the flow rate $Q_{ml}$ of the drilling fluid flowing through the motor assembly are selected; then, the pressure drop $\Delta p_{bl}$ of the drill bit nozzle, the flow rate $Q_{vl}$ of the drilling fluid flowing through the diversion nozzle, the output pressure $p_{sl}$ of the drilling pump and the pressure drop $\Delta p_{vl}$ of the diversion nozzle are calculated sequentially; finally, the equivalent area $A_{bl}$ of the drill bit nozzle and the equivalent area $A_{vl}$ of the diversion nozzle are calculated.

$$Q_{vl} = Q_s - Q_{ml} \quad (17)$$

$$\Delta p_{bl} = p_{sl} - \Delta p_l - \Delta p_{ml} \quad (18)$$

$$\Delta p_{vl} = \Delta p_{ml} + \Delta p_{bl} = p_{sl} - \Delta p_l \quad (19)$$

$$\Delta p_{bl} = \frac{0.05 \rho_d Q_{ml}^2}{C_b^2 A_{bl}^2} \quad (20)$$

$$\Delta p_{vl} = \frac{0.05 \rho_d Q_{vl}^2}{C_v^2 A_{vl}^2} \quad (21)$$

$$A_{bl} = \frac{Q_{ml}}{C_b} \sqrt{\frac{0.05 \rho_d}{\Delta p_{bl}}} \quad (22)$$

$$A_{vl} = \frac{Q_{vl}}{C_v} \sqrt{\frac{0.05 \rho_d}{\Delta p_{vl}}} \quad (23)$$

In the above formula, $A_{bl}$ and $A_{vl}$ refer to the equivalent area of the drill bit nozzle and the equivalent area of the diversion nozzle calculated in the unit of $cm^2$ according to the normal drilling working condition; other symbols have same meanings as above, all pressure units are MPa, and all flow rate units are L/s.

The equivalent area $A_b$ of the drill bit nozzle and the equivalent area $A_v$ of the diversion nozzle are selected based on the following principle by comprehensively considering calculation results given in two working conditions, that is, an idle operation and normal drilling of the screw drill.

$$A_b = \min(A_{bo}, A_{bl}) \quad (24)$$

$$A_v = \max(A_{vo}, A_{vl}) \quad (25)$$

At block (2), actual working parameters are calculated.

When the bypass valve with a large displacement diversion function is adopted, the output displacement of the drilling pump may remain unchanged, but the output pressure of the drilling pump and the diversion effect of the bypass valve both change with a load borne by the screw drill. In this case, the load borne by the screw drill may be expressed through the working pressure drop of the screw drill.

After the equivalent area $A_b$ of the drill bit nozzle and the equivalent area $A_v$ of the diversion nozzle are given, a corresponding relationship of the actual working pressure drop $\Delta p_m$ of the motor assembly and the actual flow rate $Q_m$ of the drilling fluid flowing through the motor assembly is as follows:

$$\Delta p_m + \frac{0.05 \rho_d Q_m^2}{C_b^2 A_b^2} = \frac{0.05 \rho_d Q_v^2}{C_v^2 A_v^2}. \quad (26)$$

To facilitate solving the equation, assuming that $Q_v = \chi Q_s$ and $\chi$ refers to a diversion coefficient, then $Q_m = (1-\chi) Q_s$, and the following equation is obtained by converting the formula (26).

$$\frac{0.05 \rho_d (1-\chi)^2 Q_s^2}{C_b^2 A_b^2} + \frac{0.05 \rho_d \chi^2 Q_s^2}{C_v^2 A_v^2} - \Delta p_m = 0 \quad (27)$$

A quadratic equation with one unknown is finally obtained by continuing performing conversion for the above formula.

$$\left(\frac{C_b^2 A_b^2}{C_v^2 A_v^2} - 1\right) \chi^2 + 2\chi - \left(1 + \frac{C_b^2 A_b^2}{0.05 \rho_d Q_s^2} \Delta p_m\right) = 0 \quad (28)$$

For the above new screw drill bypass valve, the drilling fluid mainly flows through the motor assembly and the drill bit nozzle, only a small portion of the drilling fluid flows through the diversion nozzle, an equivalent diameter of the drill bit nozzle is usually greater than an equivalent diameter of the diversion nozzle, that is, $$\frac{C_b^2 A_b^2}{C_v^2 A_v^2} - 1 > 0,$$

and thus only one root in the above quadratic equation with one unknown is a positive value.

$$\chi = \frac{-1 + \sqrt{1 + \left(\frac{C_b^2 A_b^2}{C_v^2 A_v^2} - 1\right)\left(1 + \frac{C_b^2 A_b^2}{0.05 \rho_d Q_s^2} \Delta p_m\right)}}{\frac{C_b^2 A_b^2}{C_v^2 A_v^2} - 1} \quad (29)$$

Figure 6:
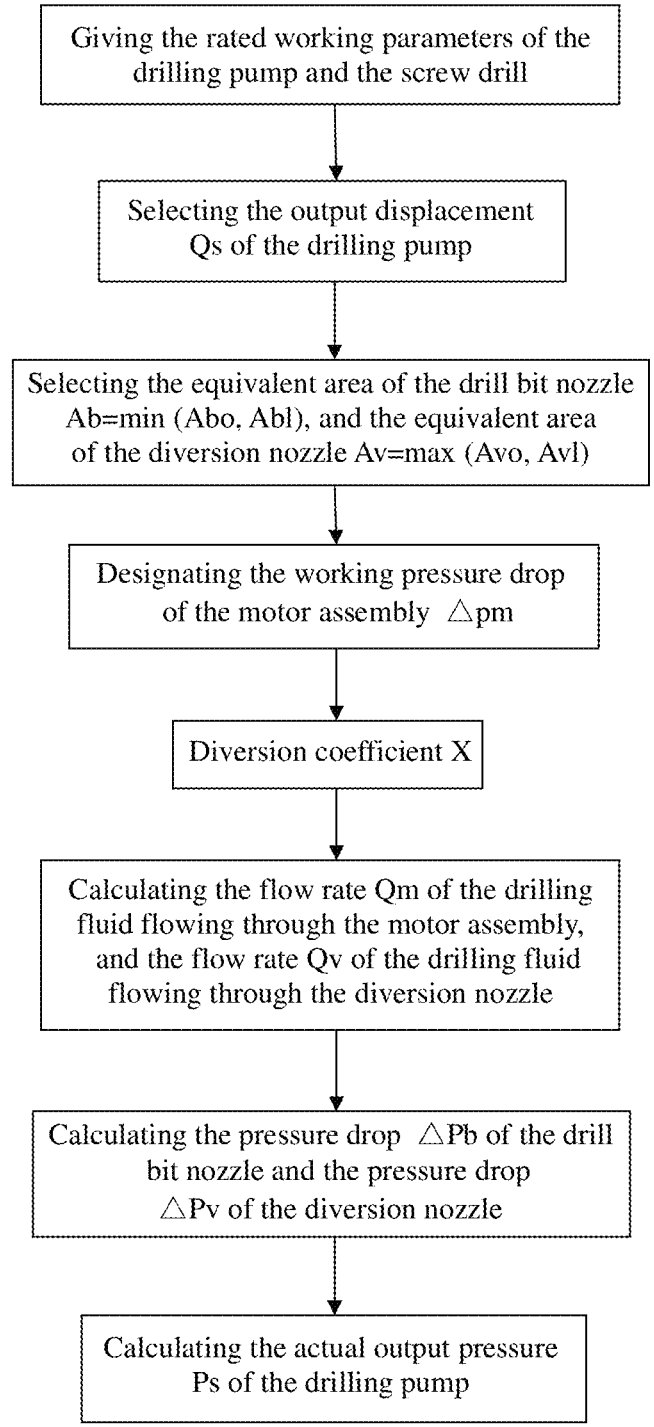
FIG. 6 is a flowchart illustrating calculating actual working parameters according to an example of the present disclosure.

In the normal drilling condition, a procedure of calculating the actual working parameters is as shown in FIG. 6. The diversion coefficient $\chi$ is obtained based on the formula (29) with a designated working pressure drop $\Delta p_m$ of the motor assembly; then, the flow rate $Q_m$ of the drilling fluid flowing through the motor assembly and the drill bit nozzle of the screw drill, the flow rate $Q_v$ of the drilling fluid flowing through the diversion nozzle, the pressure drop $\Delta p_b$ of the drill bit nozzle and the pressure drop $\Delta p_v$ of the diversion nozzle are obtained; finally, the actual output pressure $p_s$ of the drilling pump corresponding to the designated working pressure drop $\Delta p_m$ of the motor assembly is obtained.

At block (3), diversion effects corresponding to different motor pressure drops and the actual output pressure of the drilling pump are pre-calculated and a curve graph is drawn, and a load borne by the screw drill is determined by observing a change of the output pressure of the drilling pump to control a downhole drilling pressure reasonably and facilitate guiding use in a drilling field.

The present disclosure will be further described below in combination with specific application examples.

(1) Designing conditions are given as follows:

a. a screw drill model and relevant rated parameters: a rated input displacement, a rated motor pressure drop, an allowable drill bit nozzle pressure drop of a transmission shaft, and a starting pressure drop;

b. a rated displacement and a rated pressure of a drilling pump;

c. parameters of drilling fluid: density and plastic viscosity;

d. types of a drill bit nozzle and a diversion nozzle and a flow rate coefficient;

e. a current drill combination: a drill rod length, a drill rod type, a drill rod diameter, a drill collar length value and a drill collar diameter; and f. ground pipeline pressure consumption.

Known data is shown in the following Table 1.

TABLE 1

| Data Item | Data Value | Unit | Data Item | Data Value | Unit |
|---|---|---|---|---|---|
| Screw drill model | 5LZ172-7 | | Pressure drop of motor | 3.2 | MPa |
| Overall dimension | 171.5 | mm | Current well depth | 3000 | m |
| Pressure drop of drill bit nozzle | <7.0 | MPa | Length of drill rod | 2850 | m |
| Rated motor displacement | 30 | L/s | Diameter of drill rod | 12.7/10.86 | cm |
| Rated pump displacement | 36 | L/s | Type of drill rod | Flat inside | |
| Density of drilling fluid | 1.25 | g/cm$^3$ | Length of drill collar | 120 | m |
| Plastic viscosity of drilling fluid | 0.05 | Pa·s | Diameter of drill collar | 15.88/5.72 | cm |
| Coefficient of drill bit nozzle | 0.96 | | Pressure consumption of ground pipelines | 0.4 | MPa |
| Coefficient of diversion nozzle | 0.96 | | | | |

(2) Sizes of the drill bit and the diversion valve nozzle are designed and calculated.

It is assumed that the rated output displacement of the drilling pump is $Q_r=36$ L/s, and the rated output pressure is $p_r=18$ MPa. A formula of calculating the circulating pressure consumption may be referred to "Theory and Technology of Drilling Engineering" (Guan Zhichuan, Chen Tinggen, 2017).

A. The Screw Drill in an Idle (No Drilling Pressure) Working Condition the output displacement of the drilling pump $Q_s=Q_r=36$ L/s, the output pressure $p_{so}=16$ MPa, the starting pressure drop when the screw drill is idle $\Delta p_{mo}=0.8$ MPa, and the flow rate of the drilling fluid flowing through the motor assembly $Q_{mo}=Q_{mr}=30$ L/s are given.

The circulating pressure consumption $\Delta p_f=10.87$ MPa, the pressure drop of the drill bit nozzle $\Delta p_{bo}=4.33$ MPa, the flow rate of the drilling fluid flowing through the diversion nozzle $Q_{vo}=6$ L/s, the pressure drop of the diversion nozzle $\Delta p_{vo}=5.13$ MPa, the equivalent area of the drill bit nozzle $A_{bo}=3.794$ cm$^2$, and the equivalent area of the diversion nozzle $A_{vo}=0.697$ cm$^2$ are sequentially calculated.

B. The Screw Drill in a Full-Load Drilling Working Condition

The output displacement of the drilling pump $Q_s=Q_r=36$ L/S, the output pressure $p_{sl}=18$ MPa, the working pressure drop of the screw drill $\Delta p_{ml}=3.2$ MPa, and the flow rate of the drilling fluid flowing through the motor assembly $Q_{ml}=28$ L/s are given.

The circulating pressure consumption $\Delta p_f=10.87$ MPa, the pressure drop of the drill bit nozzle $\Delta p_{bl}=3.93$ MPa, the flow rate of the drilling fluid flowing through the diversion nozzle $Q_{vl}=8$ L/s, the pressure drop of the diversion nozzle $\Delta p_{vl}=7.13$ MPa, the equivalent area of the drill bit nozzle $A_{bl}=3.717$ cm$^2$, and the equivalent area of the diversion nozzle $A_{vl}=0.768$ cm$^2$ are sequentially calculated.

The equivalent area of the drill bit nozzle $A_b=3.754$ cm$^2$ and the equivalent area of the diversion nozzle $A_v=0.787$ cm$^2$ are finally determined by comprehensively considering the calculation results given in two working conditions, that is, an idle operation and normal drilling of the screw drill.

(3) A method of calculating actual working parameters is described.

When the working pressure drop of the screw drill is $\Delta p_m=3.2$ MPa, the actual diversion coefficient $\chi=0.2200$, the flow rate of the drilling fluid flowing through the motor assembly and the drill bit nozzle $Q_m=28.08$ L/s, the flow rate of the drilling fluid flowing through the diversion nozzle $Q_v=7.92$ L/s, the pressure drop of the drill bit nozzle $\Delta p_b=3.79$ MPa, the pressure drop of the diversion nozzle $\Delta p_v=7.00$ MPa, and the actual output pressure of the drilling pump $p_s=17.87$ MPa may be calculated according to the above calculation results.

It is shown in the application example that the new screw drill bypass valve provided by the present disclosure has an obvious effect of increasing the circulating displacement of the drilling fluid (the displacement is increased by 22% in the example), and the selection of the drill bit nozzle and the bypass valve diversion nozzle is the key to realize large displacement circulation and diversion.

What is claimed is:

1. A screw drill bypass valve with a displacement diversion function, comprising:
  a valve body, wherein the valve body is internally provided with
    a first-level valve core and a second-level valve core, the first-level valve core arranged above the second-level valve core, a bottom of the second-level valve core having a valve seat, and a bottom of the valve seat provided with a retaining ring;
    a first-level spring arranged between the first-level valve core and the second-level valve core; and
    a second-level spring sleeved on the second-level valve core and in a groove i-between an upper end of the second-level valve core and the valve seat, and a rigidity of the second-level spring being greater than a rigidity of the first-level spring, wherein
  a penetrating fluid channel for a drilling fluid is formed at centers of the first-level valve core and the second-level valve core,
  a side wall of the first-level valve core is provided with an inner bypass hole, a side wall of the valve body is provided with an outer bypass hole, and the inner bypass hole is in communication with the outer bypass hole when a flowing pressure within the fluid channel of the drilling fluid disappears, and
  a side wall of the second-level valve core is provided with an inner diversion hole, the side wall of the valve body is provided with an outer diversion hole, and the inner diversion hole is in communication with the outer diversion hole when the flowing pressure within the fluid channel of the drilling fluid increases to a threshold,
  wherein the screw drill bypass valve is configured that
    a. in a case of starting a pump,
      when a displacement of the drilling fluid does not exceed a rated displacement of a screw drill and the flowing pressure is smaller than the threshold, the first-level spring is compressed,
      the first-level valve core slides downward and sits on the second-level valve core,
      the outer bypass hole and the outer diversion hole are all closed, and
      all of the drilling fluid flows downward and drives a motor assembly of the screw drill to work, when the displacement of the drilling fluid exceeds the rated displacement of the screw drill and the flowing pressure is equal to or larger than the threshold,
- the first-level spring and the second-level spring are both compressed,
- the first-level valve core and the second-level valve core both slide downward,
- the outer bypass hole is in a closed state,
- the outer diversion hole is in an open state,
- the drilling fluid flows downward and drives the motor assembly of the screw drill to work, and
- a portion of the drilling fluid directly enters an annulus through the inner diversion hole and the outer diversion hole to cause the drilling fluid flowing through the motor assembly of the screw drill to not exceed the rated displacement of the screw drill; and b. in a case of stopping the pump,
- the flowing pressures on the first-level spring and the second-level spring disappear,
- the first-level valve core and the second-level valve core both move upward to an initial position,
- the inner bypass hole and the outer bypass hole are at a same horizontal height, and
- the outer bypass hole is in the open state to implement functions of the an bypass valve.

2. The screw drill bypass valve with a displacement diversion function according to claim 1, wherein
- the first-level valve core includes three inner bypass holes including the inner bypass hole, the three inner bypass holes are arranged along a circumference of the first-level valve core and a regular interval is reserved between the three inner bypass holes, and
- the valve body includes three outer bypass holes including the outer bypass hole, the three outer bypass holes are arranged along a circumference of the valve body and a regular interval is reserved between the three outer bypass holes, and
- the second-level core includes two inner diversion holes including the inner diversion hole, the valve body includes two outer diversion holes including the outer diversion hole, and the two inner diversion holes and the two outer diversion holes are arranged and symmetrically distributed along circumferences of the second-level core and the valve body respectively.

* * * * *